US006500488B1

(12) United States Patent
Chang et al.

(10) Patent No.: US 6,500,488 B1
(45) Date of Patent: Dec. 31, 2002

(54) METHOD OF FORMING FLUORINE-BEARING DIAMOND LAYER ON SUBSTRATES, INCLUDING TOOL SUBSTRATES

(75) Inventors: R. P. H. Chang, Glenview, IL (US); Kevin J. Grannen, Evanston, IL (US)

(73) Assignee: Northwestern Univ., Evanston, IL (US)

( * ) Notice: Subject to any disclaimer, the term of this patent is extended or adjusted under 35 U.S.C. 154(b) by 0 days.

(21) Appl. No.: 07/924,901

(22) Filed: Aug. 4, 1992

(51) Int. Cl.⁷ .............................. C23C 16/26; B05D 3/10
(52) U.S. Cl. ....................... 427/249; 427/307; 427/309; 427/577; 423/446; 51/307
(58) Field of Search .................................. 427/249, 450, 427/577, 215, 255.1, 307, 309; 156/650, 651; 423/446; 428/408; 117/920; 51/307

(56) References Cited

U.S. PATENT DOCUMENTS

| | | | | |
|---|---|---|---|---|
| 4,663,183 A | * | 5/1987 | Ovshinsky et al. | 427/577 |
| 4,873,115 A | * | 10/1989 | Matsumura et al. | 427/249 |
| 5,071,677 A | * | 12/1991 | Patterson et al. | 427/249 |
| 5,100,703 A | * | 3/1992 | Saijo et al. | 427/307 |
| 5,164,051 A | * | 11/1992 | Komaki et al. | 427/560 |
| 5,206,083 A | * | 4/1993 | Raj et al. | 428/323 |
| 5,238,705 A | * | 8/1993 | Hayashi et al. | 427/249 |

OTHER PUBLICATIONS

"A Quantum Chemical Investigation of Flourine in Diamond"; Nuclear Instruments and Methods in Physics Research B35; 1988; pp. 509–512; W.S. Verwoerd.
"Fluorination of Diamond (100) by Atomic and Molecular Beams"; Appl. Phys. Lett. 57 (12) ; Sep. 17, 1990; pp. 1194–1196; Andrew Freedman and Charter D. Stinespring.
"Thermal CVD of Homoepitaxial Diamond Using $CF_4$ and $F_2$"; Jul. 11, 1989; Rudder, Posthill and Markunas; 2 pages.
"The Reaction of Triphenylphosphine with Alkali Metals in Tetrahydrofuran"; Reaction of Triphenylphospine with Alkali Metals; vol. 69, No. 8, Aug. 1965; A.D. Britt and E.T. Kaiser.
"Direct Depostion of Polycrystalline Diamond Films on Si(100) without Surface Pretreatment"; Appl. Phys. Lett. 59 (7); Aug. 12, 1991; Rudder, Hudson, Posthill, Thomas and Markunas; p. 791–793.
"High–Temperature Kinetics of pyrolytic Graphite Gasification by Fluorine Atoms and Molecules"; The Journal of Physical Chemistry; vol. 77, No. 5, 1973; Rosner and Strakey; p. 690–699.
"Fluorinated Diamond Films, Slabs, and Grit"; Mat. Res. Soc. Symp. Proc.; vo. 140, 1989; Patterson, Hauge and Margrave; pp. 351–356.
"Studies of Atomic and Molecular Fouorine Reactions on Silicon Surfaces"; Appl. Phys. Lett. 48(11), Mar. 17, 1986; Stinespring and Freedman; pp. 718–720.

"Metastable Carbon phases from $CF_4$ Reactions. Part I. Reactions with SiC and Si"; High Temperature Science 10, 1978; Holcombe, Jr. Condon and Johnson; pp. 183–195.
"Metastable Carbon Phases From $CF_4$ Reactions. Part II. Reactions with $CH_3SiCl_3$"; High Temperature Science 10, 1978; Holcombe, Jr. Condon and Johnson; pp. 197–211.
"Kinetics of the Reactions of Elemental Fluorine. IV. Fluorination of Graphite"; The Journal of Physical Chemistry; vol. 69, No. 8, 1965; Kuriakose and Margrave; pp. 2772–2774.
"Mechanism of the Slow–Down of the Silicon Etch Rate by a Fluoro–Carbon Overlayer in $CF_4/H_2$ Reactive Ion Etching of Silicon"; Mat. Res. Soc. Symp. Proc. vo. 98, 1987; Oehrlein, Robey, Jaso; pp. 229–235.
"Silicon Etching Mechanisms in a $CF_4$ /$H_2$ Glow Discharge"; J. Appl. Phys. 62(2), Jul. 15, 1987; Oehrlein and Williams; pp. 662–672.
"C 1s Excitation Studies of Diamond (111). I. Surface Core Levels" American Physical Society, Phys. Rev. B, vol. 33, No. 2, Jan. 15, 1986 Morar, Himpsel, Hollinger, Jordan, Hughes & McFeely, pp. 1340–1349.
"Adhesion Strength of Diamond Films on Cemented Carbide Substrate"; Surface and Coatings Technology, 36(1988) pp. 295–302; Shibuki, Yagi, Saijo and Takatsu.
"Characterization of Diamond Films by Thermogravimetric Analysis and Infrared Spectroscopy"; Mat. Res. Bull., vol. 24, (1989) pp. 1127–1134; Johnson, Weimer and Harris.
"Characterization of Diamond Films synthesized on Si from a Gas Phase in Microwave Plasma by Slow Positrons"; Japanese Journal of Applied Physics, vol. 29, No. 3, Mar., 1990, pp. 555–559; Uedono, Tanigawa, Funamoto, Nishikawa and Takahashi.
"Oxidation Kinetics of Diamond, Graphite, and Chemical Vapor Deposited Diamond Films by Thermal Gravimetry"; J. Vac. Sci. Technol. A, vol. 8, No. 3, May/Jun. 1990, pp. 2137–2142; Joshi, Nimmagadda and Herrington.
"Properties of Diamond Composite Films Grown on Iron Surfaces"; Appl. Phys. Lett. 58(4), Jan. 28, 1991, pp. 358–360; Ong and Chang.
"Low–temperature Deposition of Diamond Films for Optical Coatings"; Appl. Phys. Lett. 55(20), Nov. 13, 1989, pp. 2063–2065; Ong and Chang.
"Early Formation of Chemical Vapor Deposition Diamond Films"; Appl. Phys. Lett. 57(25), Dec. 17, 1990, pp. 2646–2648; Iijima, Aikawa and Baba.

(List continued on next page.)

Primary Examiner—Roy V. King

(57) ABSTRACT

A method of forming a fluorine-bearing diamond layer on non-diamond substrates, especially on tool substrates comprising a metal matrix and hard particles, such as tungsten carbide particles, in the metal matrix. The substrate and a fluorine-bearing plasma or other gas are then contacted under temperature and pressure conditions effective to nucleate fluorine-bearing diamond on the substrate. A tool insert substrate is treated prior to the diamond nucleation and growth operation by etching both the metal matrix and the hard particles using suitable etchants.

6 Claims, 11 Drawing Sheets

OTHER PUBLICATIONS

"Deposition of Diamond Films at Low Pressures and their Characterization by Positron Annihilation, Raman, Scanning Electron Microscopy, and X-ray Photoelectron Spectroscopy"; Appl. Phys. Lett. 56(18), Apr. 30, 1990, pp. 1781–1783; Sharma, Dark, Hyer, Green, Black, Chourasia, Chopra, and Mishra.

"Role of Microstructure on the Oxidation Behavior of Microwave Plasma Synthesized Diamond and Diamond–like Carbon Films"; J. Mater. Res., vol. 5, No. 11, Nov. 1990, pp. 2445–2450; Nimmagadda, Joshi and Hsu.

"Microstructure of Diamond Films Near the Interface with WC Substrate"; Material Sci. Eng. A140(1990) pp. 747–752; Takatsu, Saijo, Yagi, Shibuki and Echigoya.

"Application of Diamond Films from Co–$H_2$ Plasma to Tool Blade Coating"; Journal of Mat. Sci. 26 (1991) pp. 2937–2940; Saito, Sato, Matuda and Koinuma.

"Adhesion and Tribological Properties of Diamond Films on Various Substrates"; J. Mater. Res., vol. 5, No. 11, Nov. 1990, pp. 2515–2523; Kuo, Yen, Huang and Hus.

"Factors Influencing the Adhesion of Diamond Coatings on Cutting Tools"; Vacuum, vol. 41, Nos. 4–6, 1990, pp. 1317–1321; Söderberg, Gerendas and Sjöstrand.

"Adhesion of Diamond Films on Various Substrates"; Mat. Res. Soc. Symp. Proc. vol. 168, pp. 207–213; Yen, Kuo and Hsu.

"A review of the Methods for the Evaluation of Coating–Substrate Adhesion"; Mat. Sci. and Eng., A140 (1991) pp. 583–592; Chalker, Bull and Rickerby.

"Fluorinated Diamond Films, Slabs and Grit"; Mat. Res. Soc. Symp. Proc. vol. 140 (1989), pp. 351–356; Patterson, Hauge and Margrave.

"Oxidation Studies of Fluorine Containing Diamond Films"; Dept. Mat. Sci. & Eng., Northwestern University, (1991) 14 pages; Grannen, Tsu, Meilunas and Chang.

* cited by examiner

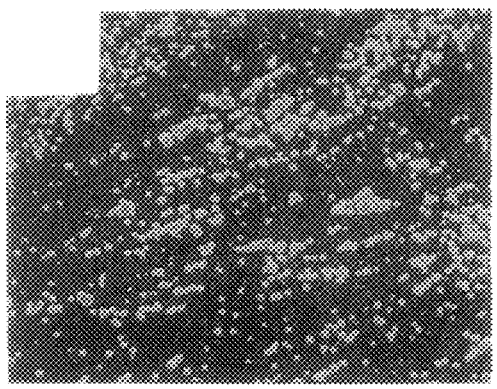
FIG. 4A
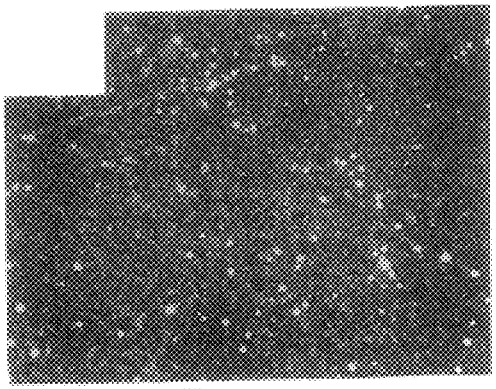
FIG. 4B
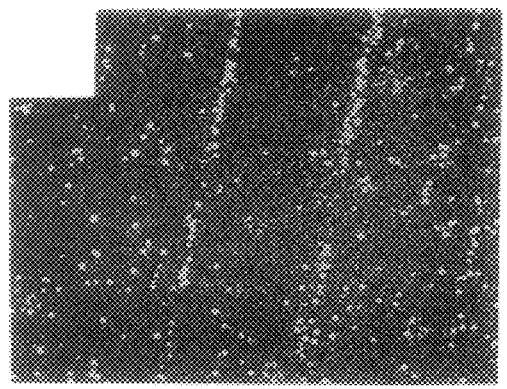
FIG. 4C
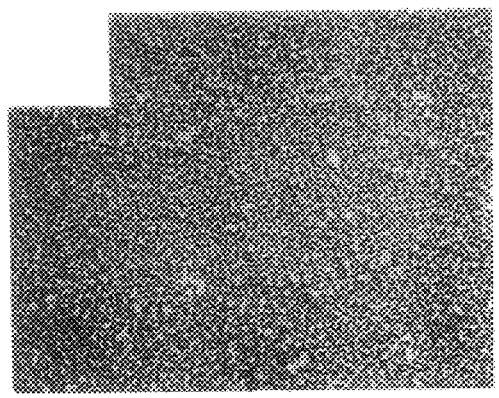
FIG. 4D
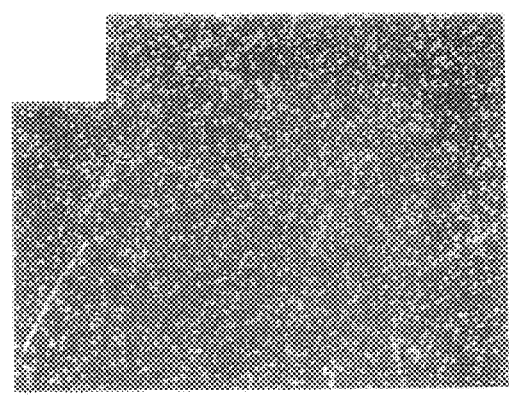
FIG. 4E
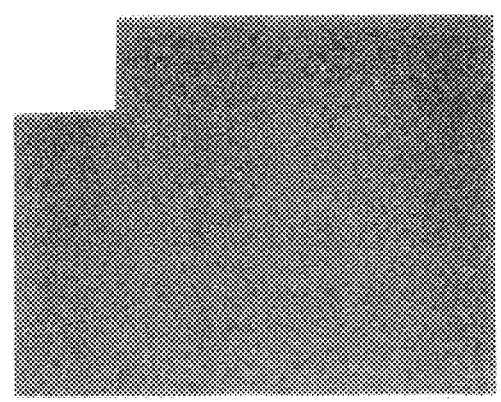
FIG. 4F  50 µm FIG. 6A
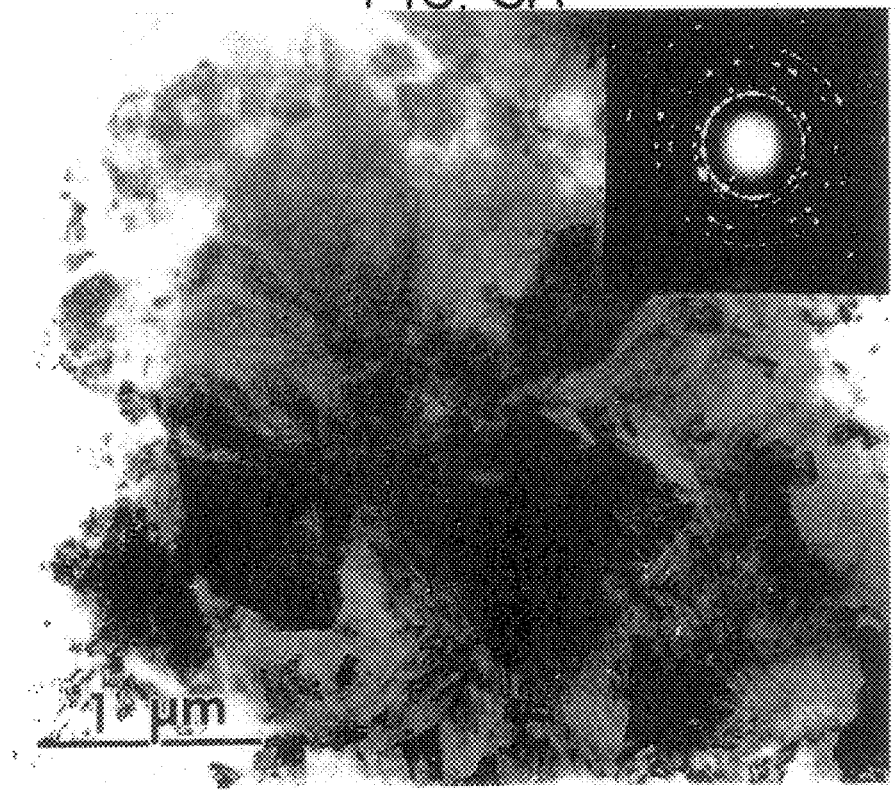
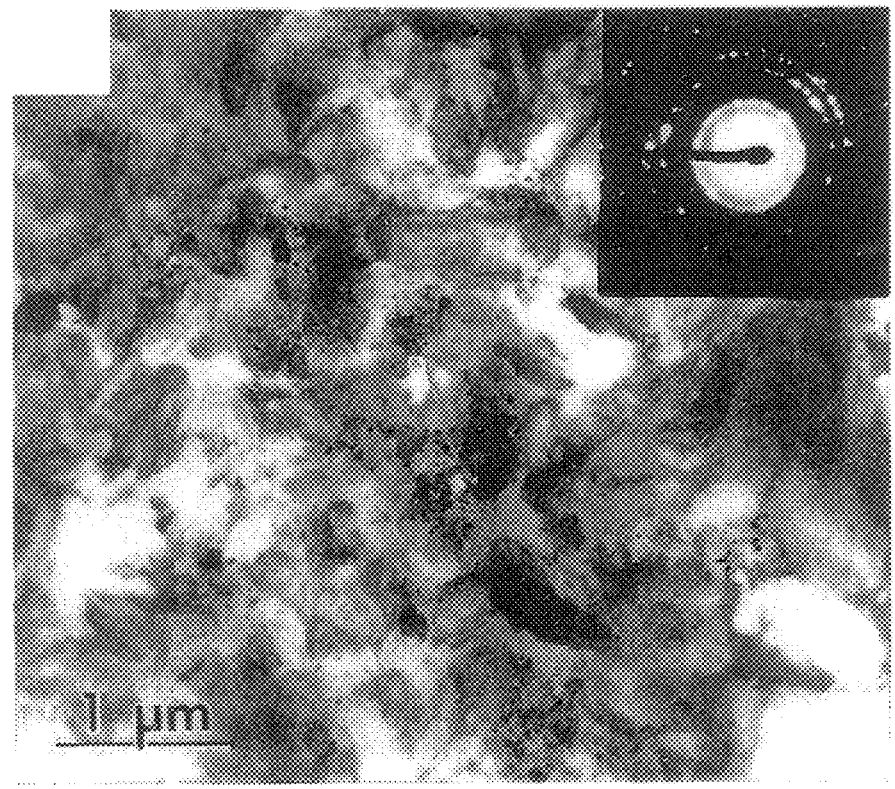
FIG. 6B

METHOD OF FORMING FLUORINE-BEARING DIAMOND LAYER ON SUBSTRATES, INCLUDING TOOL SUBSTRATES

CONTRACTUAL ORIGIN OF THE INVENTION

The United States Government has rights in this invention pursuant to Contract No. N00014-89-J-1848 between the Office of Naval Research and Northwestern University and Contract No. DE-FG 02-87ER45314 between the U.S. Department of Energy and Northwestern University, Evanston, Ill., which contracts grant to Northwestern University the right to apply for this patent.

FIELD OF THE INVENTION

The present invention relates to a method of forming an oxidation resistant diamond layer or coating on a substrate and also to a method of forming a diamond layer on a cutting tool substrate material wherein nucleation of diamond on the substrate as well as adherence of the diamond layer or coating on the substrate are substantially improved.

BACKGROUND OF THE INVENTION

As a result of many promising applications for thin diamond layers or coatings in the fabrication of wear resistant, protective coatings, optical coatings, electronic devices, etc., considerable effort has been expended in developing low pressure, low temperature processes for the deposition of these layers on various substrates, especially nondiamond substrates that would be involved in such applications. Representative of such low pressure thin diamond film deposition methods are chemical vapor deposition (CVD), plasma enhanced chemical vapor deposition (PECVD), hot filament chemical vapor deposition (HFCVD), oxygen-acetylene torch, and plasma torch techniques.

The success of chemical vapor deposition processes in depositing polycrystalline diamond layers has opened the way for potential application of the layers as protective coatings on a variety of substrate materials. For example, it is known that diamond films on steel surfaces can successfully resist corrosion, see T. P. Ong and R. P. H. Chang, *Appl. Phys.Lett.*, 58, Jan. 28, 1991. Diamond films have also been shown to be good optical coating materials which can resist mechanical wear, see T. P. Ong and R. P. H. Chang, *Appl. Phys.Lett.*, 55, 1989.

However, there are instances where diamond layers or coatings will be subjected to an oxygen-containing environment at elevated temperature. In such an environment, the diamond film can be readily oxidized (or vaporized) as indicated by A. Joshi et al. in *J. Vac. Sci. Technol.*, A8, 1990, and can oxidize much more readily compared to graphite as indicated by C. Johnson et al. in *Mater. Res. Bull.*, 24, 1990. Diamond films have been found to require more energy to oxidize compared to bulk diamond with comparable defect density, R. R. Nimmagadda et al., *J. Mater. Res.* 5, 1990.

Patterson et al. in *Mat. Soc. Symp. Proc.*, volume 140, 1989, have shown that diamond powder (or grit), single crystal diamond as well as chemical vapor deposited diamond films can be fluorinated. They found that in most instances the fluorine is attached to the external surface of the diamond. They also found that single crystal diamond slabs having such surface fluorination exhibit enhanced resistance to further oxidation.

In view of the potential application of chemical vapor deposited polycrystalline diamond layers or coatings for use on substrates in oxygen-bearing environments at elevated temperature (e.g. electronics, aerospace, cutting tool and other applications), a method for improving the oxidation resistance of such diamond layers or coatings would be desirable. Moreover, a method to improve the oxidation resistance of such diamond layers or coatings that can be incorporated in-situ in the diamond deposition operation would be desirable from a production standpoint to produce polycrystalline diamond coated substrates.

A severe drawback experienced to-date in practicing chemical vapor deposition processes for coating substrates with polycrystalline diamond has involved the need to pretreat nondiamond substrates in a manner to provide a sufficient density of diamond nucleation sites on the substrate surface to enable subsequent growth of a continuous diamond layer or coating. The most common pretreatment developed to-date to achieve the required diamond nucleation density involves abrading the substrate surface with diamond powder prior to conducting the low pressure deposition process. The Iijima et al technical article "Early Formation of Chemical Vapor Deposition Diamond Films", *Appl. Phys. Lett.*, 57, p. 2646 (1990) attributes the efficacy of the diamond powder abrading pretreatment in enhancing diamond crystallite nucleation on the substrate to the seeding action provided by residual "diamond dust" particles present on the substrate surface following the pretreatment. Unfortunately, the diamond powder abrading pretreatment constitutes a severe processing limitation for many potential applications where the diamond layer will be nucleated and grown on a nondiamond substrate and where large and/or non-planar substrate surfaces are involved.

Other pretreatments for enhancing diamond nucleation on nondiamond substrates have involved application of pump oil, diamond-like carbon films (DLC), and even fingerprints to the substrate surface. In addition, DC voltage biasing of the substrate has been employed to this same end. However, none of these techniques has been reported as providing significant nucleation enhancement during the thin diamond film deposition processes involved.

The potential applications of chemical vapor deposited polycrystalline diamond films or coatings in oxygen-bearing environments at elevated temperature (e.g. electronics, aerospace, cutting tool and other applications) in all likelihood will involve a wide variety of different substrate materials depending on the particular service application involved. Among possible substrate materials, so-called cemented carbide cutting tool materials appear to offer great potential for diamond coating to improve cutting tool performance. Such cemented carbide cutting tool substrates typically comprise a metal (e.g. cobalt) matrix and hard refractory metal carbide (e.g. tungsten carbide) particles dispersed in the metal matrix.

A method for improving the nucleation of polycrystalline diamond on such cemented carbide as well as other cutting tool substrates without the need for pretreating the substrate using the diamond powder abrading technique would be highly desirable.

A problem of poor adhesion of polycrystalline diamond layers or coatings on cemented carbide cutting tool substrates, such as tungsten carbide (WC/Co) has been experienced to-date and attracted the attention of prior art workers. For example, recent work on diamond coating of cemented carbide cutting tools has focused on 1) removal of near-surface cobalt by chemical etching (K. Shibuki et al., *Surf. Coat. Tech.*, 36, 1988) and plasma etching (Y. Saito et al., *J. Mat. Sci.*, 26, 1991) to allow diamond deposition to proceed and 2) improvement of adhesion of the diamond coating to the substrate. Adhesion strength has been accomplished by diamond seeding ( T. Y. Yen et al., *Mat. Res. Soc. Symp. Proc.,* 168, 1990 and C. T. Kuo et al., *J. Mat. Res.,* 5, 1990) and by pre-decarburizaton of the tungsten carbide (Takatsu et al., *Mat. Sci. Enq.,* 140, 1991). These methods are said to increase the nucleation density of diamond, thereby improving the bond between the substrate and the coating. Explanations for the poor adhesion of diamond coatings on cutting tools have been proposed by several workers in the art; namely, S. Soderberg et al., *Vacuum,* 41, 1990, and P. R. Chalker et al., *Mat. Sci. Eng. A,* 140, 1991.

A method for improving the adhesion of polycrystalline diamond layers or coatings on cemented carbide and other tool substrate materials to improve coating adhesion to the substrate also would be highly desirable.

An object of the present invention is to provide a method for improving the oxidation resistance of chemical vapor deposited polycrystalline diamond layers or coatings on substrates by incorporating fluorine in the diamond layers during diamond nucleation and growth during the deposition process.

Another object of the present invention is to provide a method for improving the nucleation and growth of polycrystalline diamond on tool substrate materials, such as cemented carbide materials, without the need for pretreating the substrate using the diamond powder abrading technique.

Still another object of the invention is to provide a method for improving the adhesion of polycrystalline diamond layers or coatings on tool substrate materials, such as cemented carbide materials.

SUMMARY OF THE INVENTION

The present invention involves a method of forming on a substrate a diamond layer having improved oxidation resistance wherein a deposition medium (e.g. a plasma or flame) is formed from a gaseous source of carbon and fluorine such as, for example, a fluorocarbon in hydrogen, and the substrate and the deposition medium are contacted to deposit a diamond layer including fluorine dispersed throughout the layer in an amount effective to improve the oxidation resistance of the layer at elevated temperature. Preferably, the fluorine is incorporated in a polycrystalline diamond layer at least in an amount corresponding to the internal defect density (e.g. internal voids, grain boundaries and dislocations) of the deposited diamond layer.

In one embodiment of the invention, the gaseous source comprises hydrogen carrier gas and a fluorocarbon. The gas preferably comprises at least about 3 mass % carbon tetrafluoride as the fluorocarbon.

The invention also involves a method of forming a diamond layer on a substrate comprising a metal matrix and relatively hard particles disposed in said matrix, wherein the metal matrix and the hard particles of the substrate both are chemically etched, a deposition medium is formed from a gaseous source of carbon and fluorine, and the etched substrate and the deposition medium are contacted to deposit a diamond layer on the substrate.

In one embodiment of the invention, the metal matrix and the hard particles are chemically etched by contacting the substrate with one of the matrix or hard particle etchant and then with the other of the matrix or hard particle etchant. In one particular embodiment of the invention, the matrix etchant comprises a ferric chloride solution and the hard particle etchant comprises a potassium/iron cyanide solution.

In still another embodiment of the invention, the substrate comprises a cutting tool, for example, wherein the metal matrix comprises cobalt and the hard particles comprise tungsten carbide.

A particular embodiment of the invention involves a method of forming a diamond layer on a tool substrate comprising a metal matrix and relatively hard particles disposed in the matrix wherein the metal matrix and the hard particles of the tool substrate are chemically etched by a matrix etchant and a particle etchant, a deposition medium (e.g. plasma or flame) is formed from a carrier gas (e.g. hydrogen) including fluorocarbon, and the etched tool substrate and the medium are contacted to deposit a diamond layer on the tool substrate. The nucleation and growth of the diamond on the substrate as well as diamond coating adhesion are significantly improved by the etching of both substrate components. A polycrystalline diamond layer having a thickness of about 3 to about 4 microns preferably is formed.

The present invention also involves an article comprising a substrate having a layer of diamond deposited thereon wherein the diamond layer includes fluorine dispersed therethrough. The fluorine preferably is present in a polycrystalline diamond layer in an amount to improve the oxidation resistance of the diamond layer at elevated temperature. The substrate may comprise a chemically etched metal matrix and relatively hard particles in the matrix; for example, the matrix may comprise cobalt and the hard particles may comprise tungsten carbide particles of a cutting tool substrate.

The aforementioned and other objects and advantages of the invention will become more apparent from the following detailed descriptions and the drawings which follow.

BRIEF DESCRIPTION OF THE DRAWINGS

FIGS. 4a, 4b, 4c, 4d, 4e and 4f are SEM micrographs (scanning electron micrographs) showing diamond nucleation densities after various chemical etching and growth procedures wherein in FIG. 4a and 4b the substrates are etched for 4 hours in the matrix etchant, a ferric chloride solution, in FIG. 4b and 4c the substrates are etched for 2 minutes in the particle etchant, $K_3Fe(CN)_6$ solution, and in FIG. 4e and 4f the substrates are etched sequentially first in the particle etchant and then in the matrix etchant. In FIG. 4a, 4c, and 4e, the diamond films were grown with 3% $CF_4$ for ½ hour, and in FIG. 4b, 4d, and 4f the films were grown using ½% $CH_4$-bearing gas for ½ hour.

FIGS. 6a and 6b are plan-view bright field TEM micrographs (transmission electron micrographs) and corresponding electron diffraction patterns for diamond film grown using $CH_4$-bearing gas (FIG. 6a) and a $CF_4$-bearing gas (FIG. 6b).

DETAILED DESCRIPTION OF THE INVENTION

Figure 1:
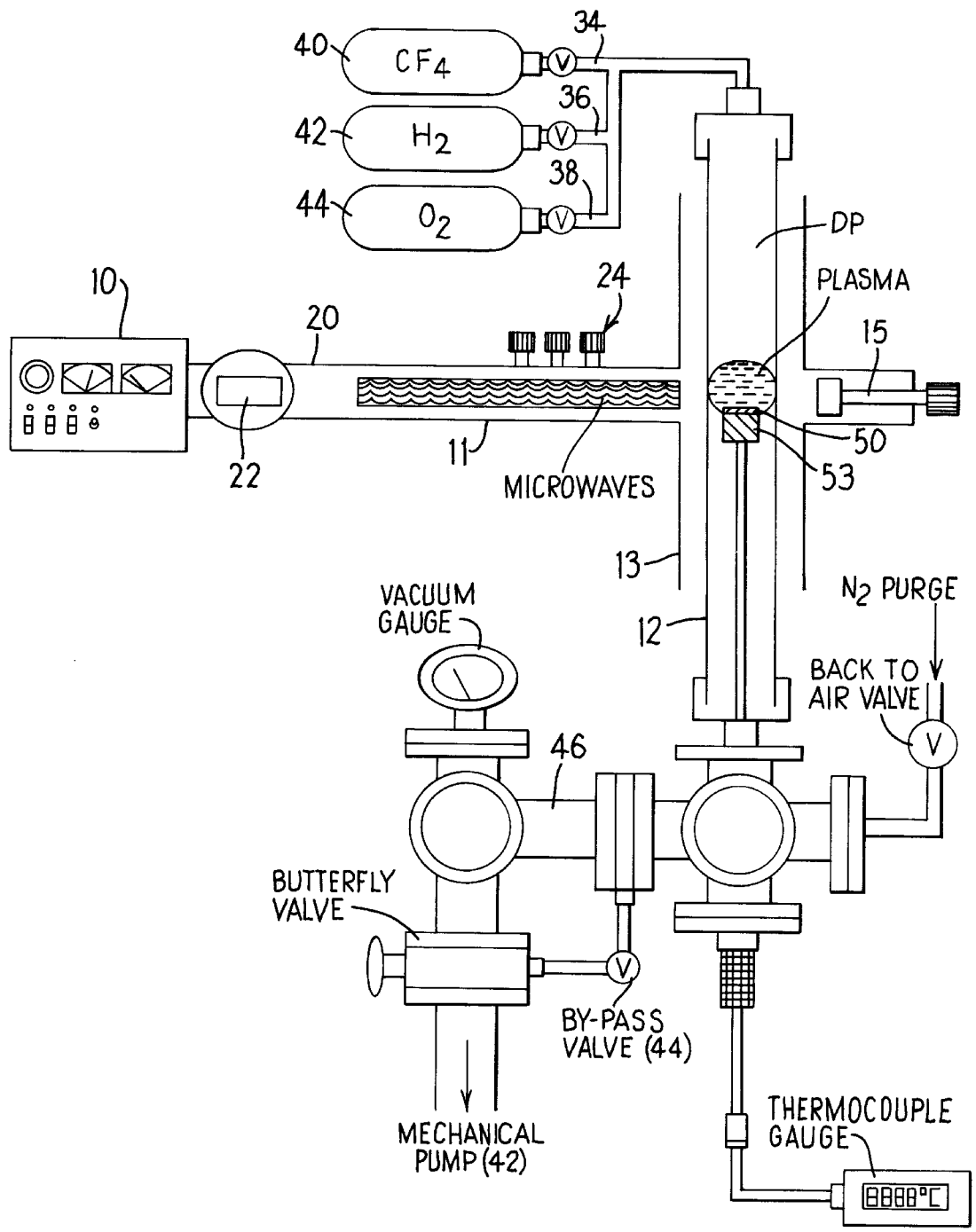
FIG. 1 is a schematic view of a microwave plasma enhanced, low pressure chemical vapor deposition (CVD) apparatus for practicing an embodiment of the method of the invention.

FIG. 1 schematically illustrates a microwave plasma enhanced chemical vapor deposition (CVD) apparatus for practicing one embodiment of the method of the invention.

In practicing a method embodiment of the invention using the microwave plasma enhanced CVD apparatus illustrated in FIG. 1, microwave energy at a frequency of 2.45 GHz is transmitted from a 1 kW generator 10 via a waveguide 11 to a cylindrical, quartz reactor 12 (25 millimeters or mm in diameter and 830 mm in length) housed inside a water-cooled microwave cavity 13. A tuning plunger 15 is cooperably associated with the microwave cavity. A 3-port circulator 20 is positioned between microwave generator and the reactor to protect the generator from any unwanted reflected power transmitted back toward the generator. Any reflected power is diverted by the circulator 20 to a water cooled dummy load 22. A three stub tuner 24 is employed to impedance match the deposition system to the generator 10, thereby maximizing the forward power transmitted into the plasma established in the reactor.

Referring to FIG. 1, a gaseous source of carbon and fluorine is supplied to the deposition region or chamber DP of the reactor 12 via a common conduit communicating with respective gas supply conduits 34, 36, 38. A preferred gaseous source of carbon and fluorine comprises an ultra-high purity fluorocarbon (e.g., $CF_4$) gas and oxygen in a carrier gas such as ultra high purity hydrogen, although the invention is not limited to this particular gaseous source as will become apparent. The gas supply conduits 34, 36, 38 extend from conventional gas cylinders or tanks 40, 42, 44 (e.g., ultra-high purity $CF_4$, hydrogen and oxygen cylinders). Hydrogen, oxygen, and $CF_4$ flow to the deposition region DP are controlled by a mass flow controller (not shown) in each of the supply conduits 34, 36, 38. The metered gas flows are mixed in the common conduit 33 to provide a desired hydrogen/oxygen/$CF_4$ composition in the deposition region DP during the nucleation stage and the growth stage of the plasma enhanced CVD process as will be described hereinbelow. Before the hydrogen/oxygen/$CF_4$ gas mixture is introduced into the deposition region DP, a mechanical vacuum pump 42 is actuated to evacuate the chamber 12 to a base pressure of about $10^{-3}$ torr. The vacuum pump 42 communicates to the chamber 12 via a pressure control valve 44, such as a bypass valve, in a conduit 46.

A thin diamond layer is formed on a suitable substrate 50 located on a graphite substrate holder 53. The substrate temperature is measured by a type-K thermocouple with the thermocouple junction positioned just beneath the graphite substrate holder and shielded by a quartz tube (diameter=6 mm)(not shown).

In accordance with one aspect of the present invention, a diamond layer having improved oxidation resistance is deposited on a substrate from a plasma or other deposition medium (e.g. deposition flame) formed from an appropriate gaseous source of carbon and fluorine; e.g. by microwave activating a carrier gas including oxygen and fluorocarbon gas. Preferably, the gaseous source comprises hydrogen and carbon tetrafluoride with a minor amount of oxygen to suppress non-diamond formation. As will become apparent from the Examples which appear herebelow, exemplary gaseous source compositions comprise 3%, 6% or 9% by mass $CF_4$, ½% by mass oxygen and the balance hydrogen. Preferably, the $CF_4$ is present in an amount of at least 3% by mass of the plasma-forming gas. Other carrier gases may possibly be used in practicing the invention and could include helium, for example. Other fluorocarbons that may be used in practicing the invention include, but are not limited to, $C_3F_8$, $C_2F_6$, and $C_4F_8$.

The gas flow rate to the deposition chamber DP can be varied to obtain nucleation and growth of a polycrystalline diamond layer or coating on a particular substrate material. Generally, gas flow rates are between about 100 to about 200 sccm (standard cubic centimeters) for the substrates described in the Examples set forth herebelow, although the invention is not limited to any particular gas flow rate parameters. The aforementioned Examples set forth illustrative gas flow rates to the deposition chamber DP for the nucleation and growth conditions as well as substrates employed therein.

A total gas pressure of approximately 30 torr is maintained in the deposition chamber DP for the Examples set forth herebelow, The invention is not limited in this regard since the total gas pressure in the chamber DP can be varied as needed to obtain desired diamond nucleation and growth for the deposition conditions and substrate materials employed.

The conditions of diamond deposition, such as plasma temperature, substrate temperature, gas composition, gas flow rate, gas pressure, and time are selected to deposit a polycrystalline diamond layer including fluorine distributed or dispersed throughout the deposited layer in an amount effective to improve the oxidation resistance of the diamond layer at elevated temperature, such as above about 700 degrees C. Typical diamond deposition conditions are set forth in the Examples herebelow.

Preferably, the amount of fluorine incorporated in the deposited diamond layer or coating at least corresponds (i.e. at least equals) the internal defect density (e.g. internal voids, grain boundaries and dislocations) of the deposited diamond layer. For example, the polycrystalline diamond layers formed in the Examples set forth herebelow averaged approximately $10^{19}/cm^3$ of fluorine distributed throughout the deposited diamond layers having thicknesses of several microns. The amount of fluorine was measured quantitatively to within a factor of 2 using secondary ion mass spectroscopy (SIMS). In addition to the fluorine distributed throughout the diamond layers, a few percent (e.g. less than 1 atomic %) of hydrogen and a fraction of a per cent (e.g. less than 1 atomic %) of oxygen were present in the deposited diamond layers.

As will become apparent from the Examples 1–4, the concentration of fluorine distributed throughout the deposited polycrystalline diamond layers of the Examples was sufficient or effective to substantially improve the oxidation resistance of the deposited diamond layer to oxygen-containing atmospheres at elevated temperatures of about 700 degrees C. and above. For example, oxidation resistance of the deposited diamond layers of the Examples was about 4 times better than non-fluorine bearing diamond layers deposited from a plasma (formed from hydrogen, ½% oxygen and ½% methane by mass) under similar deposition conditions. A maximum of about 1 atomic % fluorine distributed throughout the deposited diamond layer is preferred for purposes of improving the oxidation resistance of the layer in oxygen-containing atmospheres at temperatures of 700 degrees C. and above.

Typically, the oxidation resistant, fluorine-bearing polycrystalline diamond layer deposited on the substrate surface will have a thickness of about 1 to about 10 microns. The grown diamond layer typically exhibits a grain size less than approximately one (1) micron. Diamond deposition typically is conducted for a time period (e.g., 4–6 hours) to form a continuous polycrystalline diamond layer or film having a thickness in the range of about 1 micron to about 10 microns.

The oxidation resistant, fluorine-bearing polycrystalline diamond layer or coating can be deposited on a wide variety of nondiamond substrate materials including, but not limited to, semiconductors such as silicon, insulators such as silicon dioxide, metals, such as W, Ta, Mo, and metal compounds, such as WC, to provide articles usable in oxygen-containing atmospheres at elevated temperatures. In the Examples herebelow, the silicon substrates were polished with slurried 0.25 micron diamond powder before they were placed in the deposition chamber DP.

In practicing the invention, the substrate 50 typically is heated by direct interaction and contact with the plasma and microwave induction heating to an appropriate temperature for diamond nucleation and growth. For example, for the silicon substrates used in the Examples, a substrate temperature of about 850 to about 950 degrees C. was employed. Alternately, a separate heating device may be employed in the chamber 12 to heat the substrate to the desired temperature.

The following Examples are offered to further illustrate, but not limit, the present invention.

EXAMPLE 1

A semiconductor grade silicon substrate received from the manufacturer were cut to 1 centimeter (cm) by 1 cm in size and polished in both the (100) and (111) orientations using 0.25 micron diamond powder in a water/diamond powder slurry. The polished silicon substrate was loaded into the plasma enhanced chemical vapor deposition apparatus described above for diamond deposition. The gaseous source composition comprised 3% $CF_4$ and ½% oxygen (%'s by mass) in hydrogen at a gas flow rate of 200 sccm and a 30 torr total gas pressure. Microwave power was about 400 Watts. The substrate temperature was 900–950 degrees C. as a result of heating by the plasma. The substrate was coated under these conditions for 4 hours to nucleate and grow a continuous, fluorine-bearing polycrystalline diamond layer of about 4–6 microns thickness on the substrate.

EXAMPLE 2

The procedures of Example 1 were repeated but using 6% by volume $CF_4$ in the gas composition (rather than the 3% $CF_4$) to form a continuous, fluorine-bearing polycrystalline diamond layer of 4–6 microns thickness on a like diamond powder polished silicon substrate. Substrate temperature was 950 degrees C. and microwave power was about 350–400 Watts.

EXAMPLE 3

The procedures of Example 1 were repeated but using 9% by volume $CF_4$ in the gas composition to form a continuous, fluorine-bearing polycrystalline diamond layer of 3–5 microns thickness on a diamond like powder polished silicon substrate. Substrate temperature was 950 degrees C. and microwave power was 350–400 Watts.

EXAMPLE 4

The procedures of Example 1 were repeated but using ½% by mass $CH_4$ in the gas composition (in lieu of $CF_4$) to form a continuous, non-fluorine-bearing polycrstalline diamond layer of 3–4 microns thickness on a diamond like powder polished silicon substrate. Substrate temperature was 950 degrees C. and microwave power was 350–400 Watts. This example was used as a way to compare diamond layers grown using a $CF_4$-bearing gas with a diamond layer grown using the conventional $CH_4$-bearing gas composition.

The surface morphologies of the deposited diamond layers were examined with a scanning electron microscope (SEM) and carbon phase information pertaining to the layers was obtained by Raman spectroscopy. The SEM micrographs indicated a difference in surface morphology for diamond layers grown at the same temperature but using different gas compositions. For example, the diamond layer grown using the $CH_4$-bearing gas composition (Example 4) exhibited a triangular faceted surface, while the diamond layers grown using the $CF_4$-bearing gas compositions (Examples 1–3) exhibited continuous and rather smooth surfaces. However, the Raman spectra did not enable any differentiation between the diamond layers grown using $CH_4$-bearing versus $CF_4$-bearing gas compositions.

The amount of fluorine incorporated in the diamond layers grown in Examples 1–3 were measured quantitatively to within a factor of 2 using secondary ion mass spectroscopy. All of the diamond layers were found to include a fraction % (e.g. less than 1 atomic %) of hydrogen and a fraction % (e.g. less than 1 atomic %) of oxygen. However, the diamond layers grown using the $CF_4$-bearing gas compositions also included, on the average, approximately $10^{19}/cm^3$ of fluorine distributed or dispersed throughout the layer.

The oxidation resistance of the diamond layers of Examples 1–4 was determined using a Perkin-Elmer TGA (thermogravimetric analysis) instrument interfaced with a personal computer. The diamond coated silicon substrates were contacted with a 3:3:5 $HF:HNO_3:CH_3COOH$ etchant to remove the substrate, leaving only the diamond layer. The typical diamond layer or film sample weighed between 0.2 to 0.6 milligram, while the noise detection level of the instrument was 1 bit (1 bit=$1.5 \times 10^{-5}$ gram).

Pure oxygen was flowed into the oxidation chamber of the instrument at a rate of 40 sccm. The oxidation chamber was at atmospheric pressure. Average values for both the weight and temperature were obtained each second for the duration of the oxidation test by measurements taken every 2 ms (milliseconds) for the first 150 ms of each second, and averaging those 75 values together.

In a typical oxidation test, the temperature of the sample is manually ramped up to 700 degrees C. in approximately 15 minutes and held at that temperature (700 degrees C.) for the duration of the diamond etching test. From the weight loss curves or plots, derivatives were taken to determine etch rates as a function of time for the diamond layers of Examples 1–4.

Figure 2:
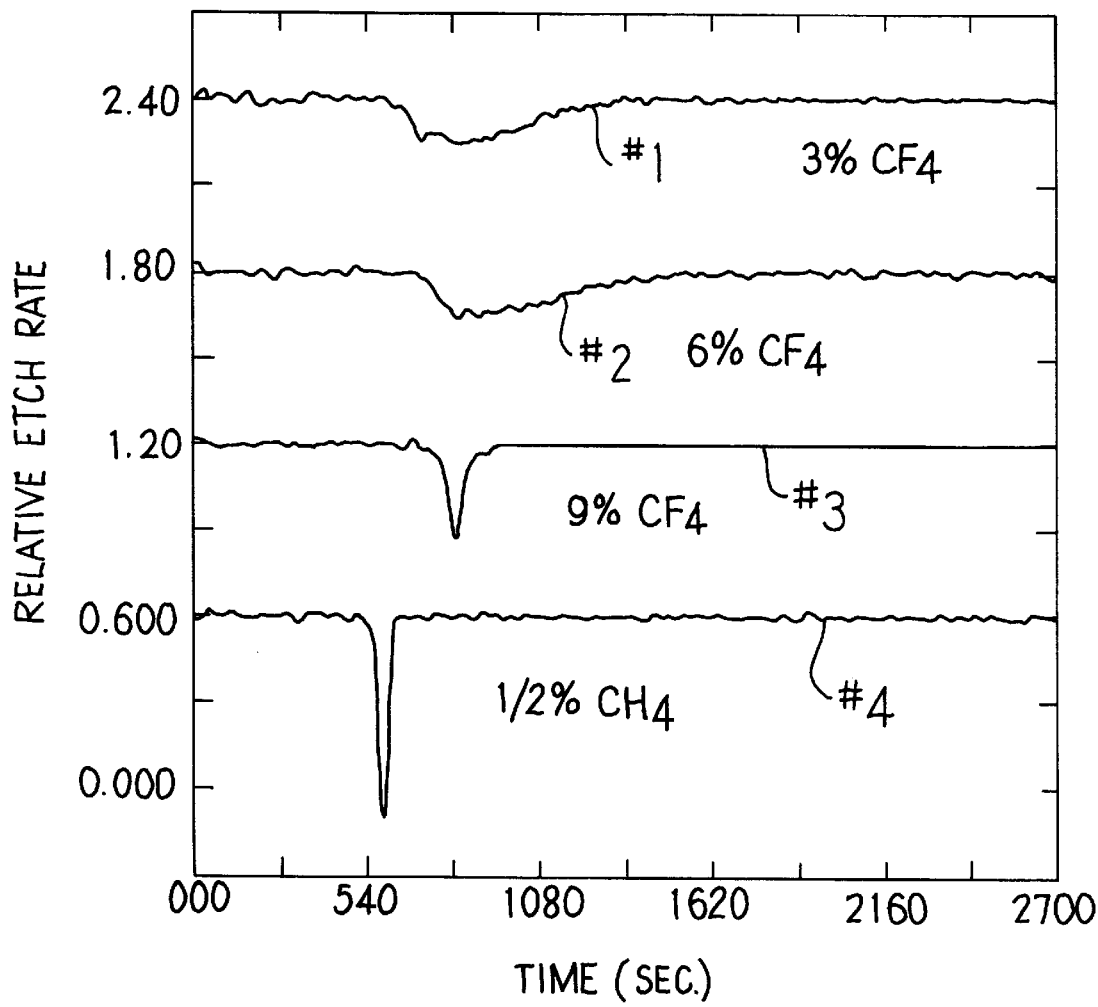
FIG. 2 is a graph of relative etch rates for diamond layers or coatings nucleated and grown with three different concentrations of $CF_4$ in the gas and with ½% $CH_4$ gas according to Example 1. Plot #1 is for 3% $CF_4$, plot #2 is for 6% $CF_4$, plot #3 is for 9% $CF_4$, and plot #4 is for $CH_4$.

FIG. 2 illustrates etch rate (weight loss over time from oxidation) plots for Examples 1–4 wherein the plots are numbered corresponding to the Example number. The relative etch rates are seen to decrease going from the 3% to 6% $CF_4$-bearing gas compositions with similar etch rates for both the 3% and 6% $CF_4$ concentrations. Moreover, these plots illustrate that, at 700 degrees C., the diamond layers formed using either 3% or 6% $CF_4$-bearing gas compositions (Examples 1 and 2) have etch rates about ¼ of that of the diamond layer grown using the $CH_4$-bearing gas composition (Example 4), bearing in mind that these etch rates are for fluorine and non-fluorine-bearing diamond layers exhibiting comparable Raman spectra.

The significant improvement in oxidation resistance exhibited by the fluorine-bearing polycrystalline diamond layers of Examples 1–3 compared to the oxidation resistance of the non-fluorine-bearing polycrystalline diamond layer is readily apparent from FIG. 1.

Figure 3:
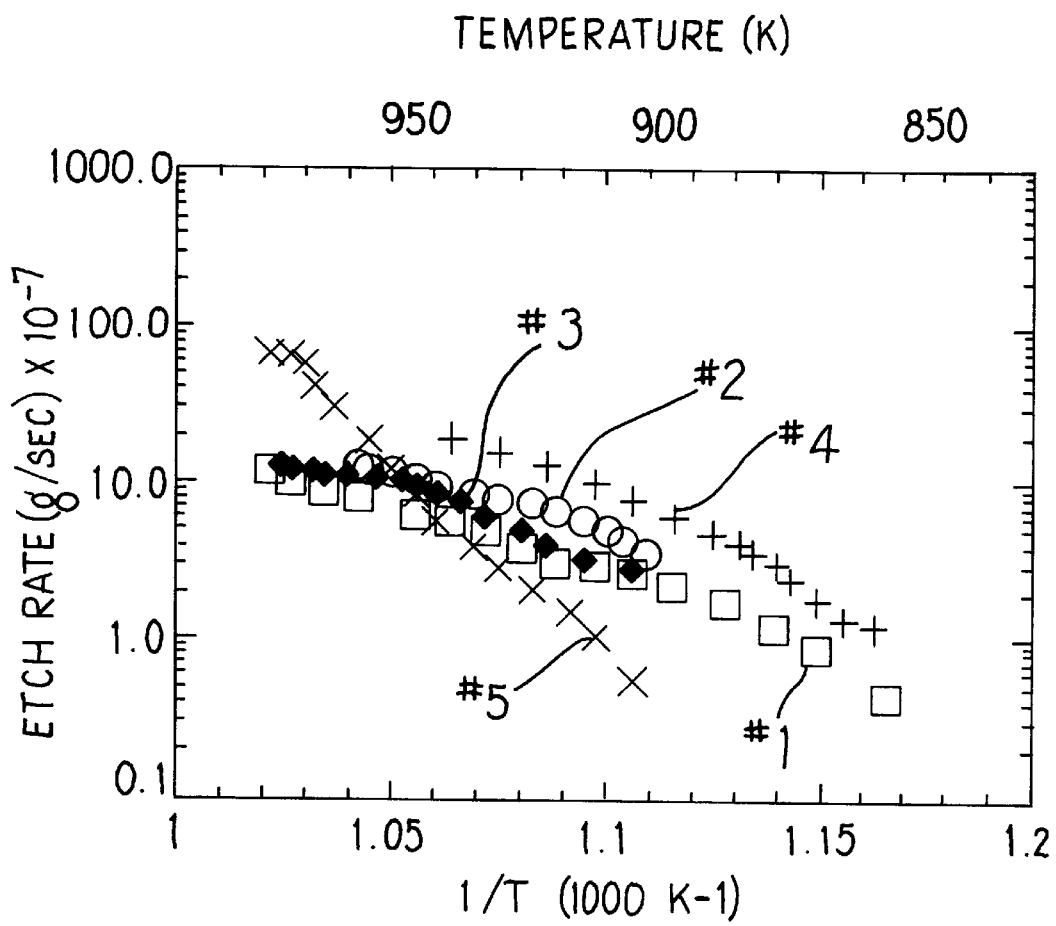
FIG. 3 is an Arrhenius graph of relative etch rates versus temperature for a variety of diamond films deposited on substrates wherein plot #1 is a faceted diamond film grown with 3% $CF_4$, plot #2 is a non-faceted diamond film grown with 3% $CF_4$, plot #3 is a diamond film grown with 6% $CF_4$, plot #4 is a diamond film grown with 9% $CF_4$, and plot #5 is a diamond film grown with ½% $CH_4$.

The oxidation etch rates as a function of temperature for the diamond layers grown with the $CF_4$-bearing gas compositions and the $CH_4$ gas composition are plotted in FIG. 3. There does not appear to be any difference in the etch rate plot between the diamond layers deposited using 3% and 6% $CF_4$-bearing gas compositions (plots 1 and 3). There is no difference in the etch rates between the diamond layers having different texture or morphology; i.e. faceted or non-faceted layers grown using 3% $CF_4$-bearing gas.

It was observed during testing that slopes of the etch rate plots (or activation energies) were about 2.3 lower for the fluorine-bearing diamond layers than for the non-fluorine diamond layer.

With the diamond layer grown using the 9% $CF_4$-bearing gas composition, the etch rate plot shifts slightly up but the shape and slope are well preserved.

Comparing diamond layers grown with $CF_4$-bearing gas compositions versus diamond layers grown using the $CH_4$-bearing gas composition, it is apparent that the latter etch 4 times faster than the former at about 700 degrees C. Although not wishing to be bound by any theory or explanation for this improved oxidation resistance of fluorine-bearing diamond layers, the inventors believe that the improvement in oxidation resistance is attributable to termination by fluorine atoms (i.e. fluorine-carbon bonds rather than carbon-carbon bonds) at both external surface bonds and at least some of the internal surface bonds (at internal voids, defects and grain boundaries in the diamond layer). The amount of fluorine incorporated in the diamond layers grown using $CF_4$-bearing gas compositions in Examples 1–3 hereabove is comparable to the density of such internal defects (as reported by slow positron measurements of Uedono et al., *Jpn. J. Appl. Phys. Lett.* 29, 1990, and Sharma et al., *Appl. Phys. Lett.*, 56, 1990).

At lower temperatures, below for example 600 degrees C., the diamond layers grown using $CF_4$-bearing gas compositions seem to etch faster than those grown using $CH_4$-bearing gas compositions.

In accordance with another aspect of the invention, a diamond layer is formed on a substrate comprising a metal matrix and relatively hard particles disposed in said matrix (the particles are hard relative to the matrix). Illustrative of such substrates are the cemented carbide materials wherein hard carbide particles are disposed in a metal matrix. Cutting tools and tool inserts are made from cemented carbides in large numbers and used by a wide variety of industries in the machining of metals, alloys, composites, and other materials. A commonly used cemented carbide cutting tool/insert comprises a cobalt matrix having tungsten carbide particles dispersed in the matrix.

This aspect of the invention involves the unexpected discovery that diamond nucleation and growth on such a substrate and adhesion of the diamond layer formed can be significantly enhanced by chemically etching the metal matrix and the hard particles thereof in combination with the subsequent diamond deposition from the carbon/fluorine bearing gas. Moreover, the invention eliminates the need to diamond polish the substrate in accordance with accepted prior art practice. The inventors have found that etching of either the matrix or the hard particles followed by the diamond deposition step is not effective in significantly enhancing diamond nucleation/growth and coating adhesion. However, chemical etching of both the matrix and hard particles in combination with the subsequent deposition from the carbon/fluorine gas is surprisingly effective in these regards. The Examples set forth herebelow will illustrate the significant benefit to diamond nucleation and diamond coating adhesion provided by the chemical etching of the matrix and the hard particles.

Chemical etching of the matrix and hard particles of the substrate is typically effected by contacting for a suitable time the substrate surface on which the diamond layer or coating is to be formed with a matrix etchant and a hard particle etchant. For a cemented carbide substrate comprising a 6 weight % cobalt (Co) matrix and 94 weight % tungsten carbide (WC) particles dispersed in the matrix (Ingersoll cutting tool grade 110), a preferred matrix etchant comprises a ferric chloride solution and a preferred hard particle etchant comprises potassium/iron cyanide solution. In particular, the matrix etchant comprising $FeCl_3$:$H_2O$ in a ratio of 1:33 by weight and a carbide (particle) etchant comprising $K_3Fe(CN)_6$:NaOH:$H_2O$ in a ratio of 1:1:10. The etchants can be swabbed onto the desired substrate surface or preferably the substrate is immersed in the etchants. The substrate can be contacted first with the matrix etchant and then with the particle etchant, or vice versa. The time of contact between the substrate and the etchants can be varied to achieve the desired improvement in diamond nucleation/growth and coating adhesion.

Importantly, after the chemical etching operation, the substrate can be subjected to the diamond deposition operation without the need to polish the substrate surface with diamond powder or paste.

Deposition of diamond on the etched substrate is conducted under similar conditions as described hereabove wherein the plasma formed from the gaseous source of carbon and fluorine and the etched substrate are contacted for a suitable time to deposit a polycrystalline diamond layer of desired thickness. In particular, in the following Examples, the etched WC—Co cemented carbide substrate was loaded into the plasma enhanced chemical vapor deposition apparatus described above for diamond deposition. The gas composition comprised 3% $CF_4$ and 1% oxygen (%'s by mass) in hydrogen at an appropriate gas flow rate and total gas pressure. The substrate was coated under these conditions for an appropriate time to nucleate and grow a continuous, fluorine-bearing polycrystalline diamond layer of about 4 microns thickness on the substrate. As the Examples herebelow will illustrate, diamond nucleation and growth on the chemically etched substrate is significantly improved. Diamond growth rates in particular are noticeably increased. Furthermore, the adhesion of the diamond layer on such etched substrates is substantially improved as measured by indentation tests.

EXAMPLE 5

A WC—Co cemented carbide substrate (Ingersoll cutting tool grade 110) was chemically etched by a particle etchant ($K_3Fe(CN)_6$:NaOH:$H_2O$ at 1:1:10) and then by a matrix etchant ($FeCl_3$:$H_2O$ at 1:33) described hereabove by immersion of the substrate therein for 2 minutes for the particle etchant and 4 hours for the matrix etchant.

The matrix/particle-etched substrate was then placed in the diamond deposition apparatus and a diamond layer deposited using a gas composition of 3% $CF_4$, 1% $O_2$, and balance hydrogen (% by mass) at a flow rate of 200 sccm and total gas pressure of 40 mBar. Microwave power was maintained between 350–400 Watts. A substrate temperature of 900 degrees C. was used. The etched substrate was subjected to deposition under these conditions for ½ hour to determine etchant effect on diamond nucleation and for 2 hours to determine etchant effect on growth of a continuous polycrystalline diamond layer.

Another matrix/particle-etched substrate was subjected to diamond deposition using a gas composition of ½% $CH_4$, 1% $O_2$, and balance hydrogen (% by mass) under like flow rate and gas pressure conditions. The coating time was ½ hour.

EXAMPLE 6

For comparison with Example 5 representing one embodiment of the invention, a WC—Co cemented carbide substrate (Ingersoll cutting tool grade 110) was chemically etched in the matrix etchant ($FeCl_3$:$H_2O$ at 1:33) described hereabove by immersion therein for 4 hours.

The matrix-etched substrate was then placed in the diamond deposition apparatus and a diamond layer deposited using a gas composition of 3% $CF_4$, 1% $O_2$, and balance hydrogen (% by mass) at a flow rate of 200 sccm and total gas pressure of 40 mBar. Microwave power was maintained between 350–400 Watts. A substrate temperature of 900 degrees C. was used. The etched substrate was subjected to deposition under these conditions for ½ hour to determine etchant effect on diamond nucleation and for 2 hours to determine etchant effect on growth of a continuous polycrystalline diamond layer.

Another matrix-etched substrate was subjected to diamond deposition using a gas composition of ½% $CH_4$, 1% $O_2$, and balance hydrogen (% by mass) under like flow rate and gas pressure conditions. The coating time was ½ hour.

EXAMPLE 7

For comparison with Example 5 representing one embodiment of the invention, a WC—Co cemented carbide substrate (Ingersoll cutting tool grade 110) was chemically etched in the particle etchant ($K_3Fe(CN)_6$:NaOH:$H_2O$) described hereabove by immersion therein for 2 minutes.

The particle-etched substrate was then placed in the diamond deposition apparatus and a diamond layer deposited using a gas composition of 3% $CF_4$, 1% $O_2$, and balance hydrogen (% by mass) at a flow rate of 200 sccm and total gas pressure of 40 mBar. Microwave power was maintained between 350–400 Watts. A substrate temperature of 900 degrees C. was used. The etched substrate was subjected to deposition under these conditions for ½ hour to determine etchant effect on diamond nucleation and for 2 hours to determine etchant effect on growth of a continuous polycrystalline diamond layer.

Another particle-etched substrate was subjected to diamond deposition using a gas composition of ½% $CH_4$, 1% $O_2$, and balance hydrogen (% by mass) under like flow rate and gas pressure conditions. The coating time was ½ hour.

EXAMPLE 8

For comparison with Example 5 representing one embodiment of the invention, a WC—Co cemented carbide substrate (Ingersoll cutting tool grade 110) was coated with an amorphous silicon layer of approximate thickness of 1200 Angstroms by RF decomposition of a gas mixture comprising 2% silane and the balance hydrogen (% by mass).

The silicon coated substrate was then placed in the diamond deposition apparatus and a diamond layer deposited using a gas composition of ½% $CH_4$, 1% $O_2$, and balance hydrogen (% by mass) at a flow rate of 200 sccm and total gas pressure of 40 mBar. Microwave power was maintained between 350–400 Watts. A substrate temperature of 900 degrees C. was used. The etched substrate was subjected to deposition under these conditions for ½ hour to determine silicon coating effect on diamond nucleation and for 8 hours to determine silicon coating effect on growth of a continuous polycrystalline diamond layer.

For the diamond coatings formed in Examples 5–8, Auger electron spectroscopy (AES) was used to determine the surface elements present during the various steps in the etching of the substrates and growth of the diamond on the substrate. Scanning electron microscopy (SEM) and transmission electron microscopy (TEM) were used to visually observe the nucleation density, the grain size, and structure of the deposited diamond. The purity/crystallinity of the diamond layers were determined by Raman spectroscopy with the 488 nm Ar+ line.

FIG. 4 shows the nucleation densities for the diamond deposited in Examples 5–8. FIG. 4a represents the nucleation density for Example 6 where only the Co matrix was etched for 4 hours in the ferric chloride solution and the diamond was formed using the 3% $CF_4$-bearing gas composition. FIG. 4b represents the nucleation density for Example 6 where the Co matrix was etched for 4 hours in the ferric chloride solution and the diamond was formed using the ½% $CH_4$-bearing gas composition. It is seen that the diamonds deposited in FIG. 4a are much denser and larger with a wider variety of crystal sizes than those of FIG. 4b. A diamond deposition test similar to the second test of Example 6 but using $CH_4$ at 3% by mass of the gas composition produced a continuous layer of soot on the substrate.

FIG. 4c represents the nucleation density for Example 7 where only the carbide particles were etched for 2 minutes in the potassium/iron cyanide solution and the diamond was formed using the 3% $CF_4$-bearing gas composition. FIG. 4d represents the nucleation density for Example 7 where only the carbide particles were etched for 2 minutes in the potassium/iron cyanide solution and the diamond was formed using the ½% $CH_4$-bearing gas composition. It is seen that the diamond nucleation density is reduced in both FIGS. 4c and 4d as compared to the nucleation densities of FIGS. 4a and 4b. The ½% $CH_4$ grown sample exhibits practically no diamond crystals, while the $CF_4$ grown sample has some diamond crystals thereon.

FIG. 4e represents the nucleation density for Example 5 where the carbide particles were chemically etched in the potassium/iron cyanide solution for 2 minutes and the matrix was chemically etched in the ferric chloride solution for 4 hours and the diamond was formed using the 3% $CF_4$-bearing gas composition. FIG. 4f represents the nucleation density for Example 5 under like etching conditions but where the diamond was formed using the ½% $CH_4$-bearing gas composition. A dense pattern of very small diamond crystals is seen on the $CF_4$ grown sample (FIG. 4e). The diamond crystals formed are much smaller than those of either FIGS. 4a or 4c grown using the $CF_4$-bearing gas composition.

The high nucleation density of FIG. 4e should provide improved layer-substrate adhesion as a result of the increased contact area between the layer and the substrate as well as fewer voids as the crystals grow to form a continuous layer.

Relatively few diamond crystals are seen in FIG. 4f grown using the $CH_4$-bearing gas composition. This is not surprising since the substrate was not diamond powder polished before deposition.

On a longer deposition time scale (i.e. greater than ½ hour), diamond coatings on the substrates etched as in FIGS. 4e have a very different appearance. A continuous layer 3–4 microns in thickness is formed after about 2 hours with the $CF_4$-bearing gas composition, while only a discontinuous layer with a large graphitic component is formed after 2 hours with the $CH_4$-bearing gas composition.

Figures 5A, 5B:
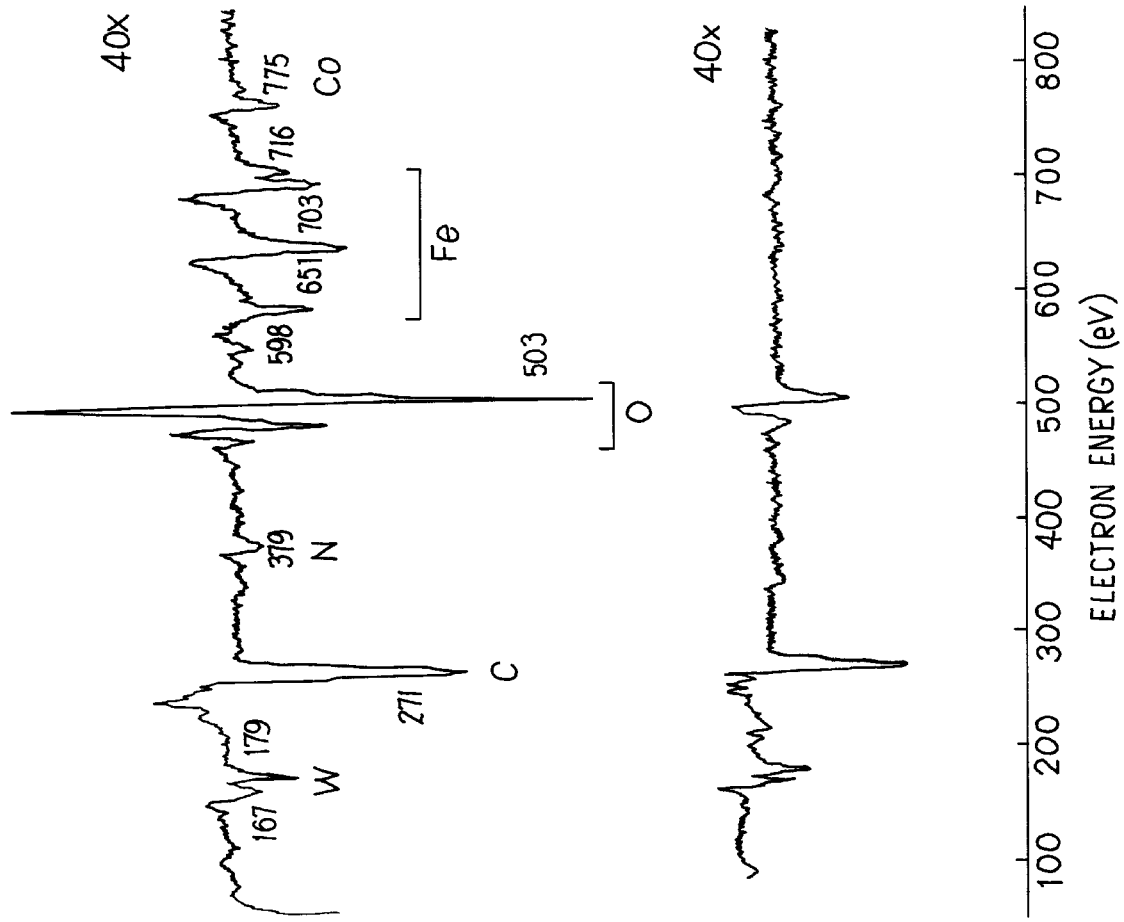
FIG. 5a is an Auger spectra of a WC—Co substrate etched with the particle etchant for 2 minutes and then the matrix etchant for 4 hours (FIG. 5a)
FIG. 5b is an Auger spectra of a similar WC—Co substrate with the same etching treatment as FIG. 5a but exposed thereafter to a plasma formed from a 3% $CF_4$-bearing gas for 5 minutes.

FIG. 5a is a Auger spectra of an WC—Co substrate chemically etched with the particle etchant and the matrix etchant without exposure to the diamond depositing plasma. Peaks identified include W at 169 and 179 eV with chlorine at 181 eV overlapping the W peak. Other peaks identified include the carbon fine structure at 252, 260, and 271 eV showing the carbidic nature of the surface, nitrogen at 379 eV, and oxygen at 468, 483, and 503 eV. Metallic species, other than W, present on the substrate surface are iron at 598, 651, 703, and 716 eV, and cobalt at 775 eV. All of these new elements, except for oxygen, are residues from the etching process. The oxygen peak is due to both etching and environmental adsorption. The etching process yields adherent films (i.e. films not easily removed from the substrate by methanol or acetone rinsing). The cobalt is probably bound with the chlorine to form cobalt chloride, while the tungsten most likely forms tungsten oxides, $W_2O_3$ being stable to around 800 degrees C.

FIG. 5b is an Auger spectra of an WC—Co substrate chemically etched with the particle etchant and the matrix etchant after exposure for 5 minutes to the diamond depositing plasma formed from the $CF_4$-bearing gas composition. This spectra exhibits W, C, and O peaks all at the characteristic energy values found in FIG. 5a, while the Co, Fe, chloride, and nitrogen peaks associated with the chemical etching operation have disappeared.

FIG. 6a and 6b illustrate the crystallinity and purity of the diamond layers grown in Example 5 using $CF_4$-bearing gas composition (FIG. 6a) and the $CH_4$-bearing gas composition. FIGS. 6a and 6b include plan-view, bright-field TEM micrographs and corresponding electron diffraction patterns. Large, well-faceted crystals (greater than 1 micron) are found in the diamond layer formed using the $CH_4$-bearing gas composition. The selected area electron diffraction pattern gives a polycrystalline pattern with diffraction rings from the diamond (111), (220), and (310) planes (first, third, and fourth rings from the center) and from the graphite (1012) plane (second ring) indicating that a significant amount of graphite is present in this layer.

Smaller diamond crystals are seen in FIG. 6b for the diamond layer formed using the $CF_4$-bearing gas composition. This is consistent with the results of FIG. 4e. The electron diffraction pattern in FIG. 6b shows only the well-defined rings of spots indicative of polycrystalline diamond; no graphite ring was present.

Figure 7A:
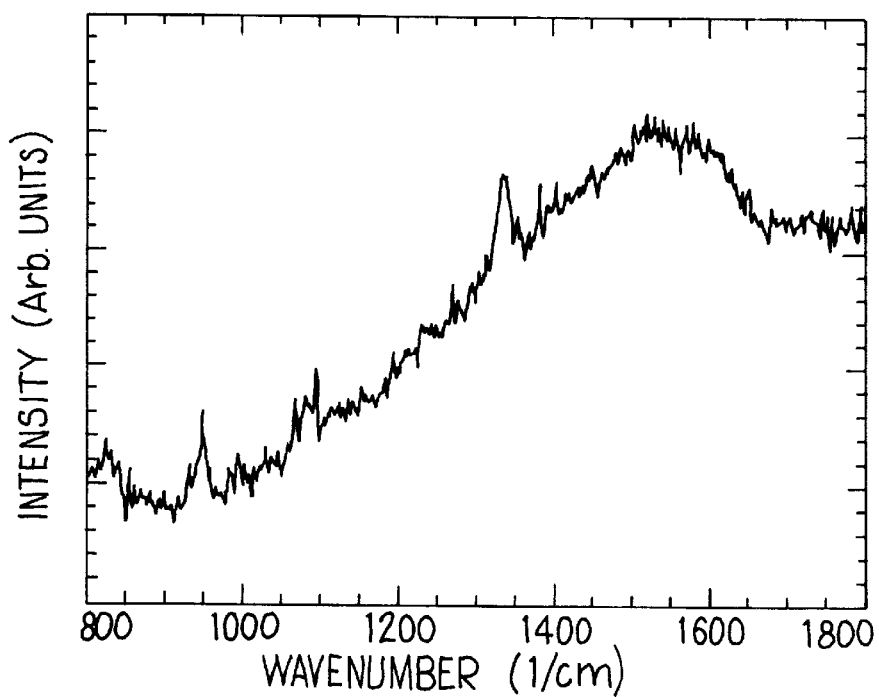
FIGS. 7a/7b and 7c/7d are Raman spectra and SEM micrographs of diamond films grown with ½% $CH_4$-bearing gas (FIG. 7a/7b) and 3% $CF_4$-bearing gas (FIG. 7c/7d).

FIGS. 7a/7b and 7c/7d illustrate the crystallinity of diamond layers formed in Example 8 (using the $CH_4$-bearing gas composition and the silicon coated substrate) and in Example 5. Crystallinity was determined by Raman spectroscopy. In FIG. 7a, the characteristic diamond peak at 1332 $cm^{-1}$ is present but it is very broad and weak in intensity. The FWHM value (full width at half maximum) of the peak is 19 $cm^{-1}$ indicating deviations from a perfect crystal lattice. This broadening can be attributed to defects in the diamond crystals brought about during the growth process. This small peak also indicated the difficulty in nucleating and growing diamond on an unseeded substrate. It is not surprising that a large graphite peak is found centered around 1580 $cm^{-1}$. This finding agrees with the electron diffraction pattern of FIG. 6b.

Figure 7C:
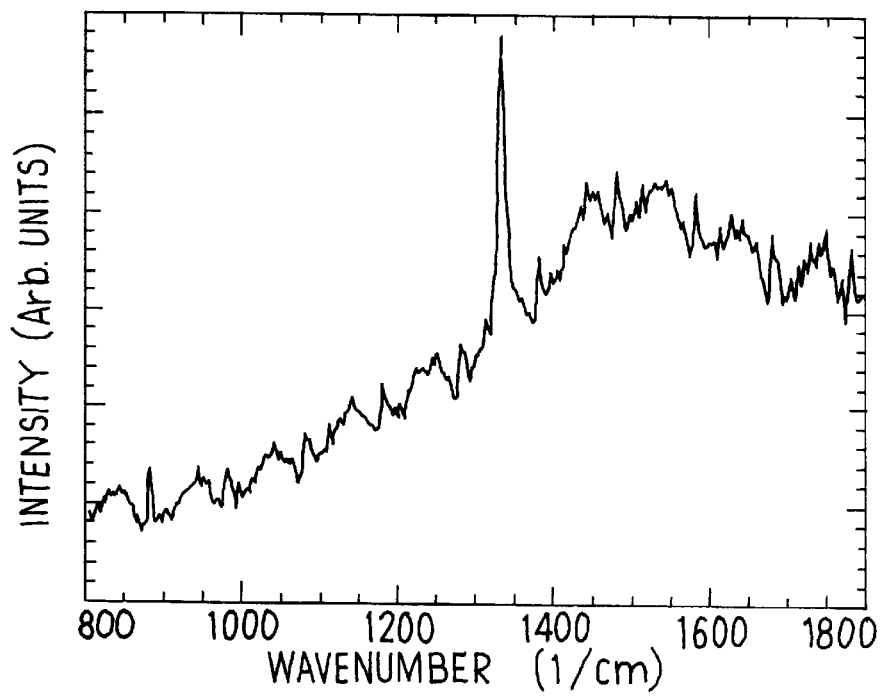

The Raman spectra of FIG. 7c is different. In particular, the characteristic diamond peak at 1332 $cm^{-1}$ is much stronger in intensity and more narrow (FWHM=8 $cm^{-1}$) when compared to FIG. 7a. Some graphitic components are also detected as seen by the small, broad "hump" centered around 1580 $cm^{-1}$, but the amount of graphite is small when the intensities of the graphite and diamond peaks and the scattering coefficients of graphite and diamond (50:1) are taken into consideration.

Figure 7B:
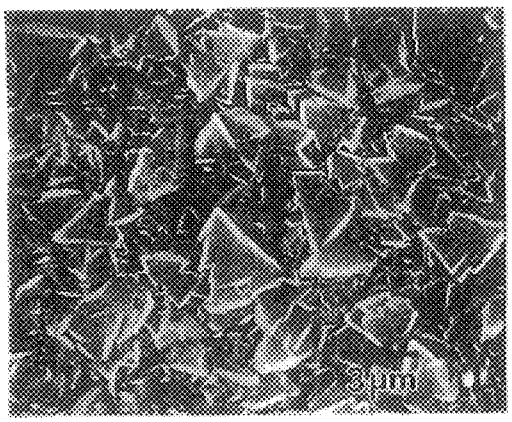
Figure 7D:
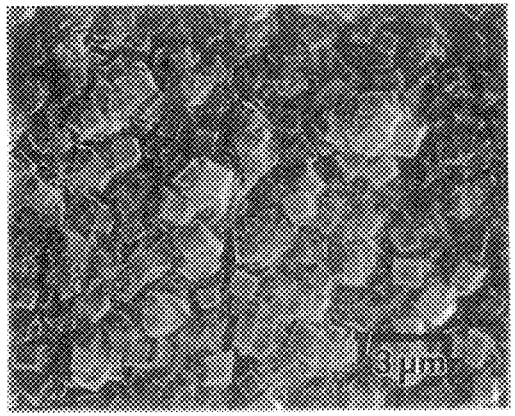

FIGS. 7b and 7d are SEM micrographs of the diamond coatings corresponding to the Raman spectra of FIGS. 7a and 7c, respectively. FIGS. 7b and 7d reveal different crystal morphology. For example, (111) facets are observed for the diamond layer grown using the $CH_4$-bearing gas composition, while (100) facets are found for the diamond layer grown using $CF_4$-bearing gas composition. The preponderance of (100) facets in FIG. 7d is surprising at this carbon concentration; i.e. an investigation of the growth of diamond on silicon using $CH_4$ source gas indicated that the (100) morphology terminates around a concentration of 1.2% $CH_4$ (see K. Kobashi et al., *Phys. Rev. B.*, 38, 1988). In using the $CF_4$-bearing gas composition, (100) facets are still found at a carbon concentration 2.5 times higher. Even higher concentrations of $CF_4$ in the gas composition (6–9%) produce a microcrystalline morphology.

The macroscopic adhesion of the diamond layers was evaluated using indentation tests conducted using a "N" Brale indenter and associated hardness tester similar to tests performed by Jindal et al., *Thin Solid Films*, 154, 1987. The test loads varied from 15 kg to 60 kg in 15 kg increments. For each indentation, crack lengths were measured at 45 degree intervals around the indentation; the eight values were averaged to yield an average crack length value for that indentation. Seven to nine indentations were made for each data point.

Figure 8:
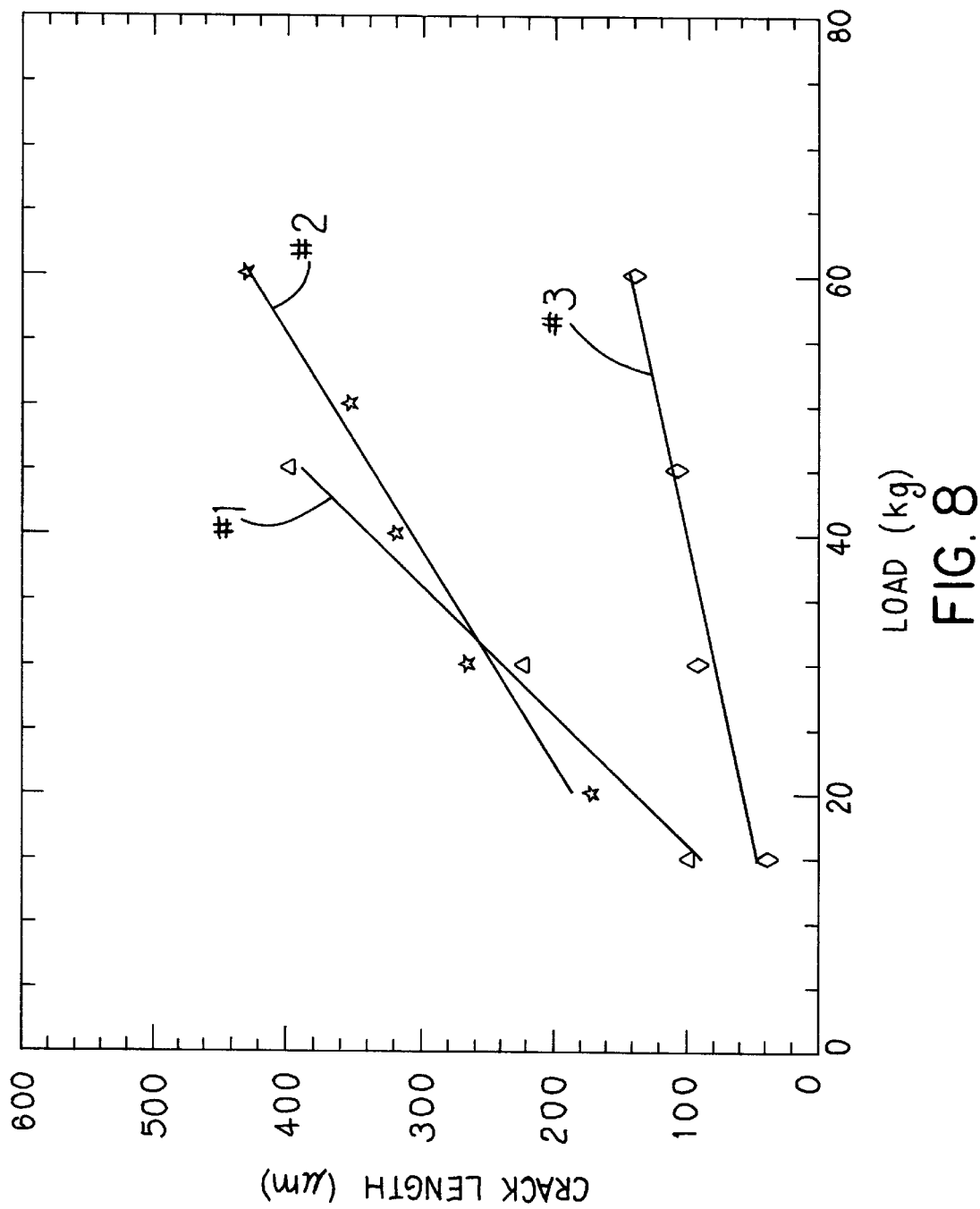
FIG. 8 illustrates indentation adhesion test results for various diamond layers grown on WC—Co tool inserts wherein plot #1 is for a diamond layer grown using ½% $CH_4$-bearing gas, plot #2 is from data from the article by C. T. Kuo et al., *J.Mat. Res.*, 5, 1990, and plot #3 is for diamond layer grown using 3% $CF_4$-bearing gas.
Figure 8A:
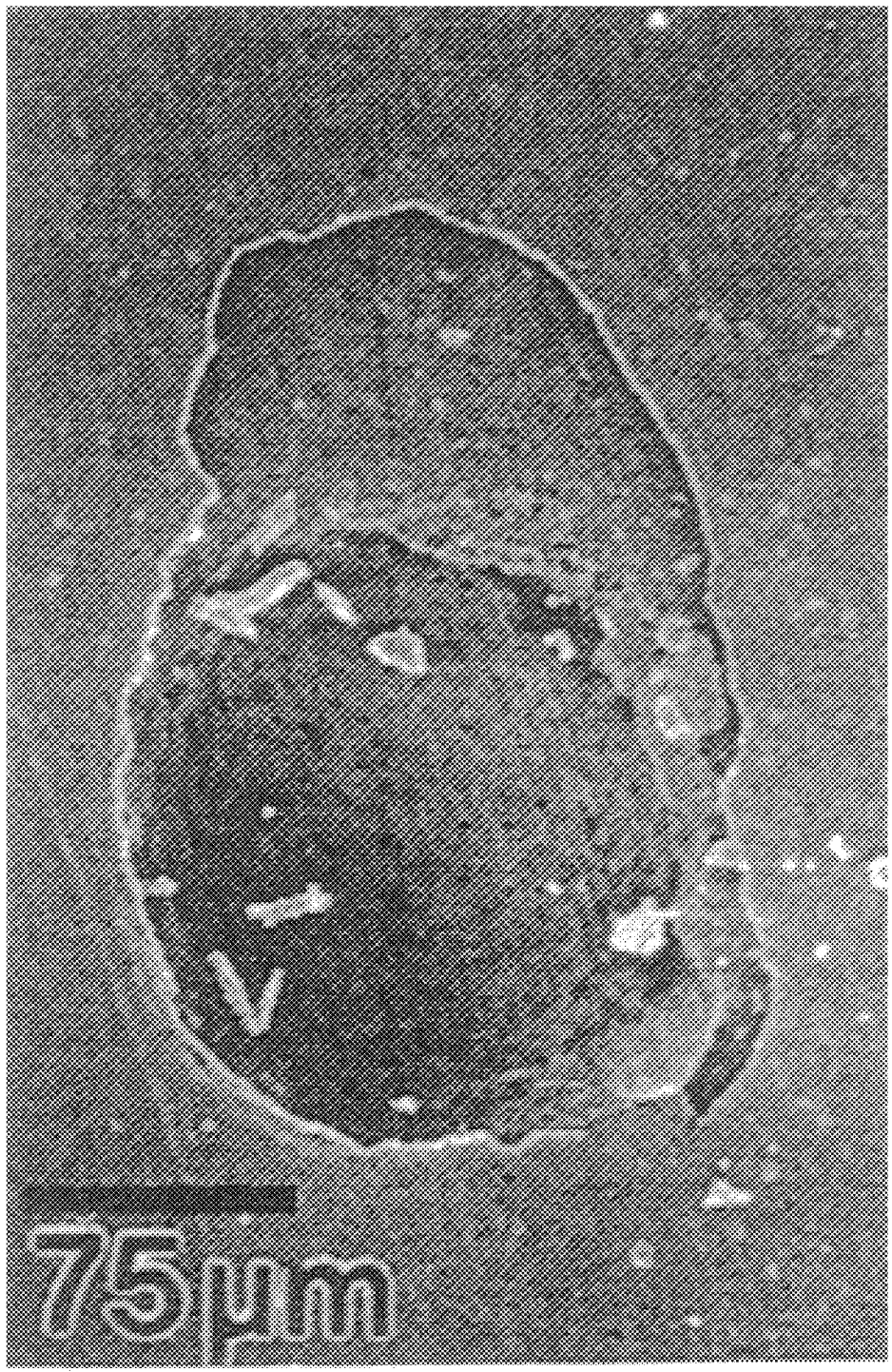
FIG. 8a is a photomicrograph of an indentation from an indention test.

FIG. 8 is a graph of crack length versus load for various diamond layers formed WC—Co substrates. The micrograph inset in FIG. 8a is a low magnification view of one indentation for purposes of illustration. The circular area in the center of the layer is the point of contact between the indenter and the layer. Around this contact zone is the portion of the layer that has delaminated from the substrate due to the applied load. The scale of FIG. 8a gives an indication of the macroscopic nature of this indentation test.

FIG. 8 depicts the wide disparity of diamond layer adhesion between the diamond layers of Example 5 formed using the $CH_4$-bearing gas composition (plot #1) and the $CF_4$-bearing gas composition of the invention (plot #3). The crack length of the latter diamond layer monotonically increases with the load and approaches 150 microns at 60 kg of load. This contrasts to crack length of 400 microns at 60 kg for the former (i.e. the diamond layer formed using $CH_4$-bearing gas). Throughout the test, the adhesion of the diamond layer formed using the $CF_4$-bearing gas was found to be a factor of two or more better than the adhesion of the diamond layer formed using $CH_4$-bearing gas.

The diamond layer formed on the silicon coated substrate (Example 8) exhibited rather large crack lengths in the indentation tests. The same was true for a diamond layer (plot #2 in FIG. 8) formed on a pre-seeded substrate described by T. Y. Yen et al., *Mat. Res. Soc. Symp.Proc.,* 168, 1990, and C. T. Kuo, *J. Mat.Res.,* 5, 1990.

Figure 9:
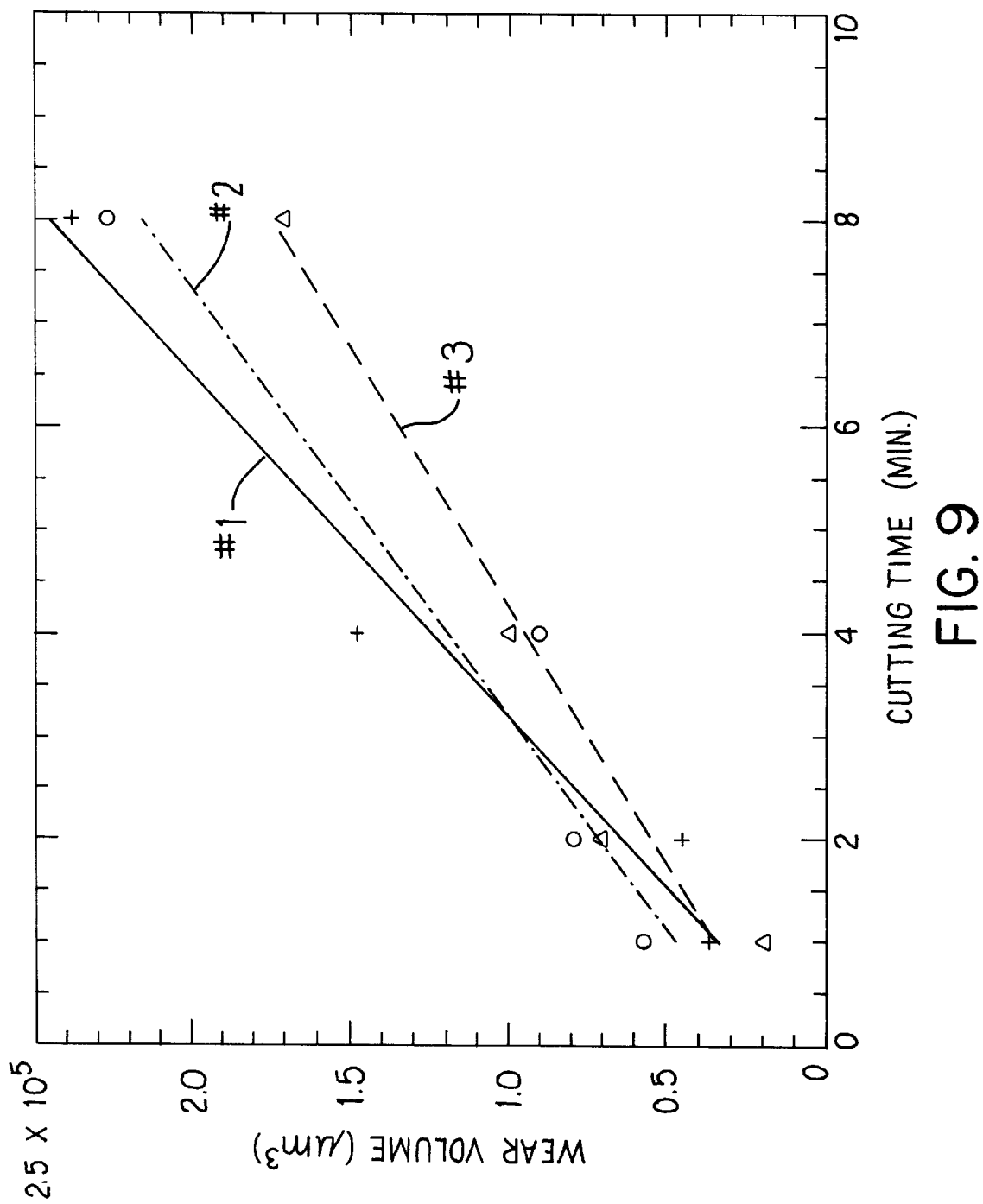
FIG. 9 depicts wear volume versus cutting time for various coated and uncoated tool inserts wherein plot #1 is for an uncoated insert, plot #2 is for an insert with a diamond film grown using ½% $CH_4$-bearing gas, plot #3 is for an insert coated with a diamond film grown using 3% $CF_4$-bearing gas.

FIG. 9 is a graph of wear volume (volume of tool insert abraded away) versus cutting time for an uncoated insert (plot #1), an insert coated using ½% $CH_4$-bearing gas (Example 5) (plot #2), and an insert coated using 3% $CF_4$-bearing gas (Example 5) (plot #3). The machining conditions employed for the tests were as follows:

Machine Parameters
  speed: 152 m/min
  feed: 0.254 mm/revolution
  depth of cut: 1.27 mm
  cutting time: 1,2,4, and 8 minute intervals
  coolant: none
Tool Insert
  material: 390 aluminum
  hardness: less than 20 HrC as-cast
  actual material
    composition: 16.9% Si, 0.29% Fe, (weight %) 4.9% Cu, 0.13% Ti, less than 0.01% Mn, Cr, Ni and Zn, balance Al Each data point is the result from one tool insert used for a specified machining time. Four tool inserts of the same type were used for each plot, resulting in some spread of the experimental data. A least square fit was performed to find the trend of the data. All three plots start in the same general vicinity. After one minute of cutting time, very little difference is seen in the abraded wear volume. After a longer cutting time, differences began to appear. The volume wear rates (slope of each plot) are as follows: 0.31 microns$^3$/min for the uncoated substrate, 0.24 microns$^3$/min for the substrate coated with diamond using $CH_4$-bearing gas (like Example 5), and 0.20 microns$^3$/min for the substrate coated with diamond using $CF_4$-bearing gas (like Example 5). A 50% improvement in the volume wear rate is seen between an uncoated tool insert and a diamond coated tool insert using $CF_4$-bearing gas (like Example 5). Correlating the wear rate to the indentation results, there is a recognition that a better indentation adhesion value translates to a better wear volume.

Although the invention has been described herein-above as being practiced using a plasma enhanced, low pressure CVD apparatus/process, the invention is not so limited and may be practiced using other thin diamond film deposition apparatus/processes including, but not limited to, hot filament CVD, non-plasma enhanced CVD, gas torch or flame, plasma torch and laser ablation.

While the invention has been described in terms of specific embodiments thereof, it is not intended to be limited thereto but rather only to the extent set forth in the following claims.

The embodiments of the invention in which an exclusive property or privilege is claimed are defined as follows:

1. A method of forming a diamond layer on a substrate comprising a metal matrix and relatively hard, diamond-free particles, as compared to hardness of said matrix, disposed in said matrix, comprising:
   a) chemically etching the metal matrix by contacting said matrix with an etchant that selectively etches said matrix,
   b) chemically etching the relatively hard particles by contacting said particles with another etchant that selectively etches said particles,
   c) forming a deposition medium from a gaseous source comprising carbon and fluorine, and
   d) contacting the chemically etched substrate and the medium to vapor phase deposit a continuous diamond layer on the chemically etched substrate.

2. The method of claim 1 wherein the metal matrix and the relatively hard particles are chemically etched by sequentially contacting the substrate with said etchant and then said another etchant or vice versa.

3. The method of claim 2 wherein the metal matrix comprises cobalt and the relatively hard particles comprise tungsten carbide.

4. The method of claim 3 wherein said etchant comprises an acidic ferric chloride solution and said another etchant comprises a potassium/iron cyanide solution.

5. The method of claim 1 wherein the gaseous source comprises hydrogen and fluorocarbon.

6. The method of claim 5 wherein the gaseous source comprises at least about 3% by mass carbon tetrafluoride as the fluorocarbon.

* * * * *

UNITED STATES PATENT AND TRADEMARK OFFICE
CERTIFICATE OF CORRECTION

| | | |
|---|---|---|
| PATENT NO. | : 6,500,488 B1 | Page 1 of 1 |
| APPLICATION NO. | : 07/924901 | |
| DATED | : December 31, 2002 | |
| INVENTOR(S) | : R. P. H. Chang et al. | |

It is certified that error appears in the above-identified patent and that said Letters Patent is hereby corrected as shown below:

Column 1, lines 8-14, should read; CONTRACTUAL ORIGIN OF THE INVENTION
This invention was made with government support under Grant No. DE-FG 02-87ER45314 awarded by the Department of Energy and N00014-89-J-1848 awarded by the Office of Naval Research. The government has certain rights in the invention.

Signed and Sealed this
Twenty-ninth Day of March, 2011

David J. Kappos
*Director of the United States Patent and Trademark Office*